United States Patent [19]
Inoue

[11] Patent Number: 6,060,951
[45] Date of Patent: May 9, 2000

[54] SEMICONDUCTOR DEVICE

[75] Inventor: Akira Inoue, Tokyo, Japan

[73] Assignee: Mitsubishi Denki Kabushiki Kaisha, Tokyo, Japan

[21] Appl. No.: 09/167,966

[22] Filed: Oct. 8, 1998

[30] Foreign Application Priority Data

Jun. 2, 1998 [JP] Japan .................................. 10-153027

[51] Int. Cl.⁷ ................................ H03F 3/14; H03F 3/68
[52] U.S. Cl. ........................................... 330/307; 330/295
[58] Field of Search .................................... 330/286, 295, 330/307, 68

[56] References Cited

U.S. PATENT DOCUMENTS

| | | | |
|---|---|---|---|
| 5,095,285 | 3/1992 | Khatibzadeh | 330/306 |
| 5,111,157 | 5/1992 | Komiak | 330/307 |
| 5,352,990 | 10/1994 | Goto | 330/286 |
| 5,420,541 | 5/1995 | Upton et al. | 330/295 |
| 5,818,880 | 10/1998 | Kriz et al. | 330/307 |

FOREIGN PATENT DOCUMENTS

| | | |
|---|---|---|
| 63-279608 | 11/1983 | Japan . |
| 3112159 | 5/1991 | Japan . |
| 8139535 | 5/1996 | Japan . |
| 8237001 | 9/1996 | Japan . |

OTHER PUBLICATIONS

Raab, "Class–F Power Amplifiers With Maximally Flat Waveforms", IEEE Transactions on Microwave Theory and Tecniques, vol. 45, No. 11, Nov. 1997, pp. 2007–2012.

*Primary Examiner*—Robert Pascal
*Assistant Examiner*—Patricia T. Nguyen
*Attorney, Agent, or Firm*—Leydig, Voit & Mayer, Ltd.

[57] ABSTRACT

A semiconductor device includes a semiconductor substrate having a first main surface and a second main surface opposite the first main surface; a semiconductor chip amplifying a high frequency signal and including semiconductor cells on the first main surface, each semiconductor cell including semiconductor components and being connected to a gate pad and a drain pad, each semiconductor component having an electrode; internal matching circuits; a harmonic matching circuit for each semiconductor cell and connected between the semiconductor chip and one of the internal matching circuits, the harmonic matching circuit including a capacitor and an inductor; and a package enclosing the semiconductor substrate, the semiconductor chip, the internal matching circuits, and the harmonic matching circuit. In this structure, since harmonics are processed in each semiconductor cell, the phases of the harmonics processed in the semiconductor cells are uniform. Losses caused by the characteristic of harmonic signals themselves and a phase difference due to transmission line differences between the harmonic matching circuit and the semiconductor chip are reduced, improving harmonic load impedance.

18 Claims, 11 Drawing Sheets

SEMICONDUCTOR DEVICE

FIELD OF THE INVENTION

The present invention relates to a semiconductor device that is mainly used in a high frequency band, and, more particularly, to a semiconductor device comprising a semiconductor chip including a plurality of semiconductor cells, each cell including a plurality of semiconductor components, within a package.

BACKGROUND OF THE INVENTION

It is known that in a semiconductor device amplifying signals of a certain frequency harmonics are generated as distortion outputs due to a non-linear characteristic of the amplification, resulting in reduced output efficiency of the fundamental waves which are included in the original signal.

FIG. 9 is a partial top view of a semiconductor chip 90 used in a conventional semiconductor device. In the figure, reference numeral 1 designates a gate pad, numeral 2 designates a drain pad, numeral 3 designates a gate electrode, numeral 4 designates a source electrode, numeral 5 designates a drain electrode, numeral 6 designates gate wiring interconnecting the gate pad 1 and the gate electrodes 3, and numeral 7 designates a drain wiring interconnecting the drain pad 2 and the drain electrodes 5. The gate wiring 6 and the drain wiring 7 generally comprise a metal such as Au or Al. Reference numeral 8 designates a semiconductor substrate comprising GaAs, InP, or the like. Reference numeral 9 designates a semiconductor cell which is a part of the semiconductor chip 90.

FIG. 10 is a top view illustrating the structure of a conventional semiconductor device 100 including the semiconductor chip 90. FIG. 11 is an equivalent circuit diagram of the semiconductor device 100 shown in FIG. 10. In the figures, the same reference numerals as in FIG. 9 designate the same or corresponding parts. Reference numeral 10 designates an input-side external matching circuit, numeral 11 designates an output-side external matching circuit, numeral 12 designates a package, numeral 13 designates an input-side internal matching circuit, and numeral 14 designates an output-side internal matching circuit. The input-side internal matching circuit 13 and the output-side internal matching circuit 14 normally comprise substrates made of alumina or the like, respectively. Reference numeral 15 designates a wire, and numeral 16 designates a lead extended from the package 12. In the semiconductor chip 90, reference numeral 17 designates a via hole which electrically interconnects the source electrode 4 and a ground electrode on the back surface of the semiconductor chip 90 (not shown). The package 12 works as a ground electrode comprising a conductor, such as Cu or CuW, and is electrically connected to the ground electrode on the back surface of the semiconductor chip 90.

FIG. 12 is an equivalent circuit diagram of the semiconductor cell 9. In the figure, $L_G$ indicates a parasitic inductance of the gate wiring 6, $C_{Gpd}$ indicates a capacitance of the gate pad 1, $L_D$ indicates a parasitic inductance of the drain wiring 7, and $C_{Dpd}$ indicates a capacitance of the drain pad 2. The semiconductor cell 9 comprises a plurality of semiconductor components connected to one gate pad 1 and one drain pad 2 in the semiconductor chip 90, and it is regarded as an operation unit of the semiconductor chip 90.

FIG. 13 is a circuit diagram illustrating a first example 130 of the output-side external matching circuit 11. In the figure, reference numeral 18 designates a distributed constant circuit having a length P, and numeral 19 designates a resistor having a resistance R. Reference numeral 20 designates an inductor, and numeral 21 designates a capacitor. The output-side external matching circuit 130 includes two circuits, each comprising a combination of an inductor 20 and a capacitor 21 connected in parallel. The inductors 20 have inductances $L_1$ and $L_3$, respectively, and the capacitors 21 have capacitances $C_1$ and $C_3$, respectively.

FIG. 14 is a circuit diagram illustrating a second example 140 of the output-side external matching circuit 11. In the figure, the same reference numerals as in FIG. 13 designate the same or corresponding parts. The output-side external matching circuit 140 comprises a circuit having a combination of an inductor 20 and a capacitor 21 connected in series. The inductor 20 has an inductance $L_0$, and the capacitor 21 has an inductance $C_0$.

Hereinafter a description is given of the operation of the conventional semiconductor device having the above-described structure. Initially, in the case of the output-side external matching circuit 130, if the two circuits, each having a combination of an inductor 20 and a capacitor 21, are set so that the following relations are established in the respective circuits:

$$\frac{1}{2\pi\sqrt{L_1 C_1}} = f \quad (1)$$

$$\frac{1}{2\pi\sqrt{L_3 C_3}} = 3f$$

an impedance Z of the semiconductor chip 90 viewed from the side of the drain electrode 5 with respect to a frequency nf (n: positive integer) of a harmonic of a high-frequency wave 111 (fundamental wave) having a frequency f, is $$z = \begin{cases} R & \text{for } f \\ 0 & \text{for } nf \ (n = 2, 4, 5, \ldots, n \ne 3) \\ \infty & \text{for } 3f \end{cases} \quad (2)$$

At this time, in the output-side external matching circuit 11, a second harmonic having a frequency that is an even multiple of the frequency of the fundamental wave is short-circuited, and a third harmonic having a frequency that is an odd multiple of the frequency of the fundamental wave is open circuited. This means that a high efficiency operation, so-called Class-F amplification, is realized (see "Class-F Power Amplifiers with Maximally Flat Waveforms", IEEE TRANSACTIONS ON MICROWAVE THEORY AND TECHNIQUES, Vol. 45. No.11, November 1997).

As described above, when the output-side external matching circuit 130 shown in FIG. 13 is used as an external matching circuit, the operational efficiency of the semiconductor device can be improved by controlling harmonics with class-F amplification.

Next, in the case of the output-side external matching circuit 140, the following relation is established between the inductor 20 and the capacitor 21:

$$\frac{1}{2\pi\sqrt{L_0 C_0}} = 2f \quad (3)$$

In this case, the fundamental wave can be amplified while a second harmonic as a distortion output is short-circuited at the output side, thereby improving the operational efficiency of the semiconductor chip.

In the operations of the output-side external matching circuits 130 and 140, the parasitic capacitance $C_{Dpd}$ and inductance $L_D$ exist in the semiconductor chip 90 as shown in the equivalent circuit diagram of FIG. 12. An input fundamental wave is affected by these parasitic capacitances and inductance and thus its harmonics are normally out of the phases of ideal short-circuiting and open circuiting.

Therefore, in the conventional semiconductor device, the phases of harmonics are corrected by adjusting the length P of the distributed constant circuit 18 in a simulation, so as to implement the ideal short-circuiting and open circuiting.

In the conventional semiconductor device described above, as the frequency of an input high-frequency wave becomes higher, the input/output impedance of the semiconductor chip 90 is reduced, thereby increasing the loss between the external matching circuit 10 and the semiconductor chip 90. For example, when f=20 GHz, a loss caused by a second harmonic having a frequency 2f=40 GHz amounts to several dB, thereby considerably degrading the efficiency of the semiconductor device.

To solve the above-described problems, in the conventional semiconductor device, the internal matching circuits 13 and 14 are provided near the semiconductor chip 90 to match to an input fundamental wave (frequency f), thereby preventing a reduction in the load impedance in the semiconductor chip 90.

Further, Japanese Published Patent Application No. Sho.63-279608 proposes a technology for improving operational efficiency, wherein circuits for matching with a second harmonic as well as with a fundamental wave are added to internal matching circuits of the class F amplifier.

However, in the prior art semiconductor devices, since the path lengths of the wires interconnecting the external and internal matching circuits with the respective semiconductor cells 9 within the semiconductor chip 90 are not uniform or the accuracy of the lengths of the wires themselves varies, the external matching circuits and the internal matching circuits cannot process the fundamental wave or harmonics in optimal phases for each semiconductor cell 9 which is a component of the semiconductor chip 90.

Therefore, the prior art semiconductor device cannot produce a harmonic impedance optimized for the semiconductor chip 90, and thus does not satisfactorily improve the amplification efficiency.

SUMMARY OF THE INVENTION

It is an object of the present invention to provide a semiconductor device which can provide a harmonic impedance optimized for a semiconductor chip, without being dependent on variations in the pass lengths between the semiconductor chip and the internal and external matching circuits and variations in the accuracy of the wire lengths.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a semiconductor device which comprises: a semiconductor substrate having a first main surface and a second main surface opposite to the first main surface; a semiconductor chip performing amplification in high frequency band and including a plurality of semiconductor cells on the first main surface of the semiconductor substrate, each semiconductor cell comprising a plurality of semiconductor components connected to a gate pad and a drain pad, each semiconductor component having an electrode; internal matching circuits; a harmonic matching circuit provided for each semiconductor cell and between the semiconductor chip and one of the internal matching circuits, the harmonic matching circuit comprising a capacitor having a capacitance and an inductor having an inductance; and a package enclosing therein the semiconductor substrate, the semiconductor chip, the internal matching circuits, and the harmonic matching circuits. In the above-described structure, since harmonics are processed in the vicinity of a semiconductor chip corresponding to each semiconductor cell to make the phases of the harmonics treaded in each semiconductor cell uniform, it is possible to realize reduction in a phase difference caused by the variations in the path lengths between the harmonic matching circuits and the semiconductor chip, in addition to reduction in a loss caused by the characteristics of harmonic signals. Thereby, an improved harmonic load impedance can be obtained. Therefore, the efficiency of the semiconductor device as a while can be improved.

According to a second aspect of the present invention, the semiconductor device of the first aspect further includes external matching circuits outside the package. Therefore, the above-described effects can be obtained.

According to a third aspect of the present invention, in the semiconductor device of the first or second aspect, the harmonic matching circuits are integrated into the semiconductor chip on the first main surface of the semiconductor substrate. In this structure, since the variations in the path lengths between the semiconductor chip and the harmonic matching circuits are considerably reduced, the variations in the phase differences are substantially eliminated and thus an optimal harmonic load impedance can be obtained. In addition, it is possible to reduce the parts count and the number of wires, resulting in miniaturized package and reduced manufacturing costs.

According to a fourth aspect of the present invention, the semiconductor device of the third aspect includes an MIM capacitor between the electrode of the semiconductor component and the drain pad as the capacitor of the harmonic matching circuit. In this structure, since the variations in the path lengths between the harmonic matching circuits and the semiconductor chip are considerably reduced, the variations in the phase differences are substantially eliminated.

According to a fifth aspect of the present invention, the semiconductor device of the third aspect includes the capacitor of the harmonic matching circuit between the electrode of the semiconductor component and the drain pad. Therefore, the capacitor can be arranged at an arbitrary position on the semiconductor chip.

According to a sixth aspect of the present invention, the semiconductor device of the third aspect includes the inductor of the harmonic matching circuit between the wiring of the drain pad and the second main surface of the semiconductor substrate. Therefore, the design flexibility of the semiconductor chip can be increased.

According to a seventh aspect of the present invention, in the semiconductor device of the third aspect, the inductor of the harmonic matching circuit is an inductance of a wiring interconnecting the drain pad and the electrode of the semiconductor component. Therefore, the size of the semiconductor chip can be reduced.

According to an eighth aspect of the present invention, in the semiconductor device of any of the first to third aspects, the harmonic matching circuit is a low-pass filter circuit using the capacitance of the drain pad as a capacitor and the inductance of a wiring interconnecting the electrode of the semiconductor component and the drain pad as an inductor. Therefore, harmonic matching can be performed for each semiconductor cell without using an MIM capacitor or a gap capacitor to form the harmonic matching circuit.

According to a ninth aspect of the present invention, in the semiconductor device of the eighth aspect, the inductor of the low-pass filter circuit is an inductance of a wire disposed on the drain pad. Therefore, in this semiconductor device, no inductor has to be required on the semiconductor chip.

DESCRIPTION OF PREFERRED EMBODIMENTS

Figure 2:
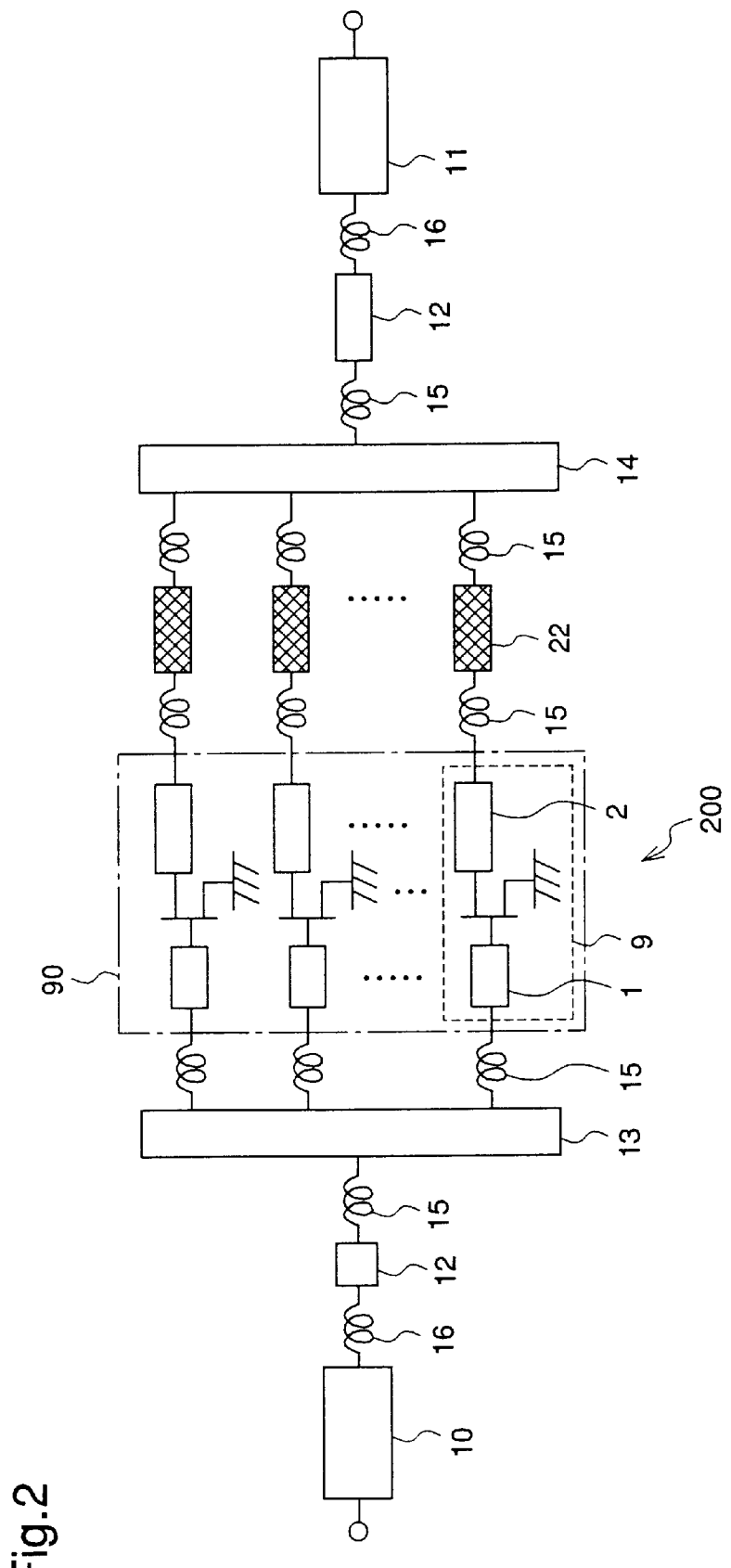
FIG. 2 is an equivalent circuit diagram of a semiconductor device of the present invention.
Figure 11:
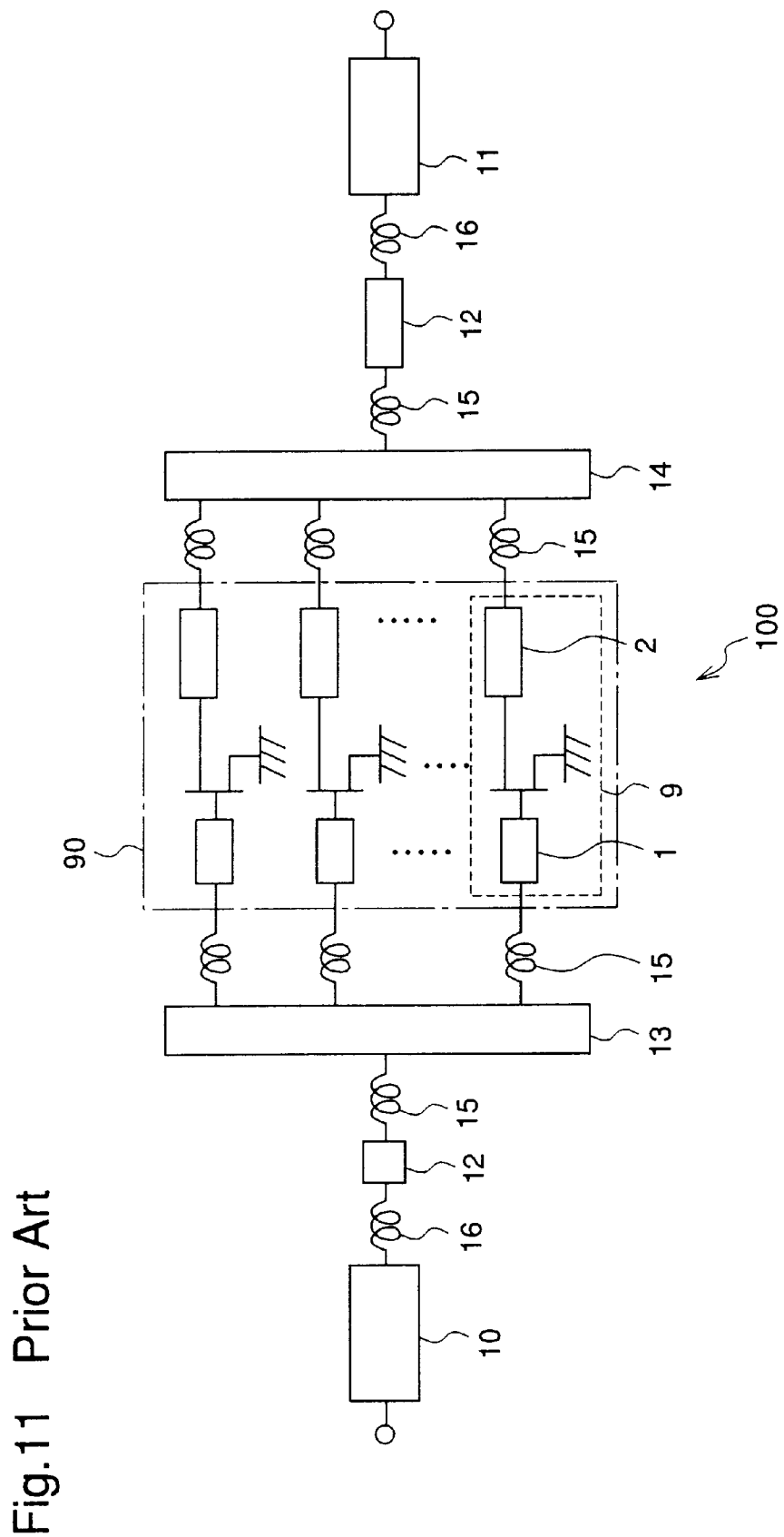
FIG. 11 is an equivalent circuit diagram of the semiconductor device 100 shown in FIG. 10.

FIG. 2 is an equivalent circuit diagram of a first semiconductor device of the present invention. In the figure, reference numeral 200 designates a semiconductor device, numeral 22 designates a harmonic matching circuit, and the same reference numerals as in FIG. 11 designate the same or corresponding parts.

As shown in the figure, the first semiconductor device 200 of the present invention is structurally identical to the conventional semiconductor device 100 except that a harmonic matching circuit 22 is further provided for each semiconductor cell, between the semiconductor chip 90 and the output-side internal matching circuit 14, so that the harmonic matching circuit 22 can process harmonics in the vicinity of the semiconductor chip 90 to keep the phases of the harmonics uniform.

Therefore, in the first semiconductor device 200, since the harmonic matching circuits 22 process harmonics in the vicinity of the semiconductor chip 90 to keep the phases of the harmonics uniform, it is possible to realize a reduction in a phase difference caused by the variations in the path lengths between the harmonic matching circuits and the semiconductor chip, in addition to a reduction in a loss due to the characteristics of the harmonics. Thereby, it is possible to obtain an improved harmonic load impedance and increase the efficiency of the semiconductor device as a whole.

However, the first semiconductor device 200 has the following disadvantage. In this semiconductor device, the harmonic matching circuits and the semiconductor cells 9 are interconnected by means of wires, as in the conventional semiconductor device. The lengths of the wires actually have differences of several tens to several hundreds of micrometers depending on the accuracy, and the variations in the path lengths due to the nonuniformity of the wire lengths cause the phase differences of harmonics.

Figure 3:
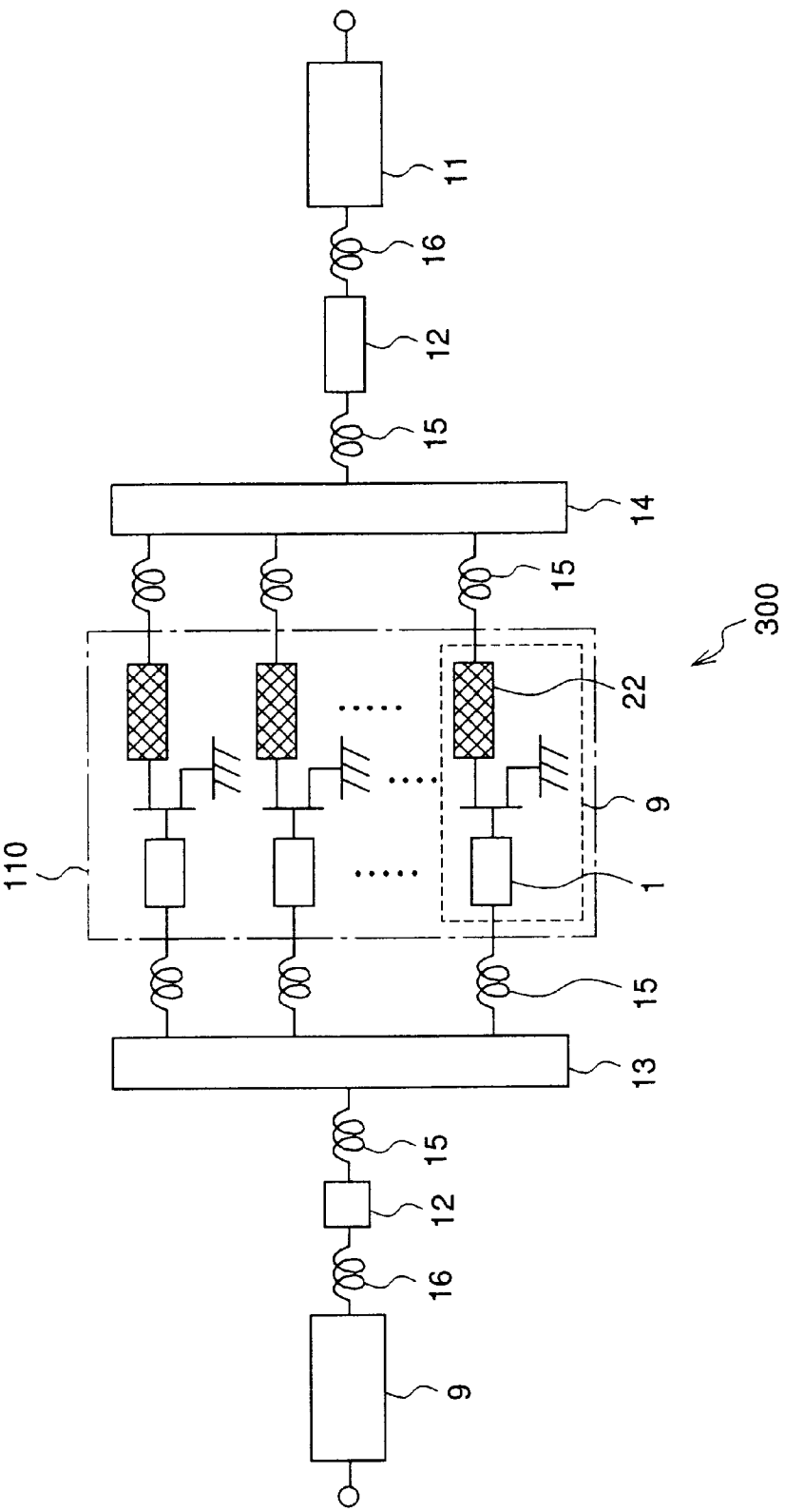
FIG. 3 is an equivalent circuit diagram of a semiconductor device of the present invention.

FIG. 3 illustrates a second semiconductor device of the present invention capable of solving the above problem, wherein the harmonic matching circuits are integrated into the semiconductor chip.

In the second semiconductor device 300, a semiconductor chip 110 contains a harmonic matching circuit 22 arranged on a drain pad or the like in each semiconductor cell 9. In the semiconductor chip 110, since the variations in the path lengths between the harmonic matching circuits 22 and the semiconductor cells 9 depend on the patterning accuracy of the semiconductor chip 110, the variations in the path lengths can be reduced by one or more orders of magnitude in comparison with the case of the first semiconductor device wherein the harmonic matching circuits 22 are connected with the semiconductor cells 9 by means of wires.

Thus, in the second semiconductor device 300 of the present invention, since the phase differences of harmonics caused by the variations in the path lengths between the harmonic matching circuits and the semiconductor chip are substantially eliminated, an optimal harmonic load impedance is available, thereby further improving the operational efficiency in comparison with the first semiconductor device 200.

Hereinafter a description is given of the embodiments concerning the second semiconductor device 300.

Embodiment 1.

Figure 1:
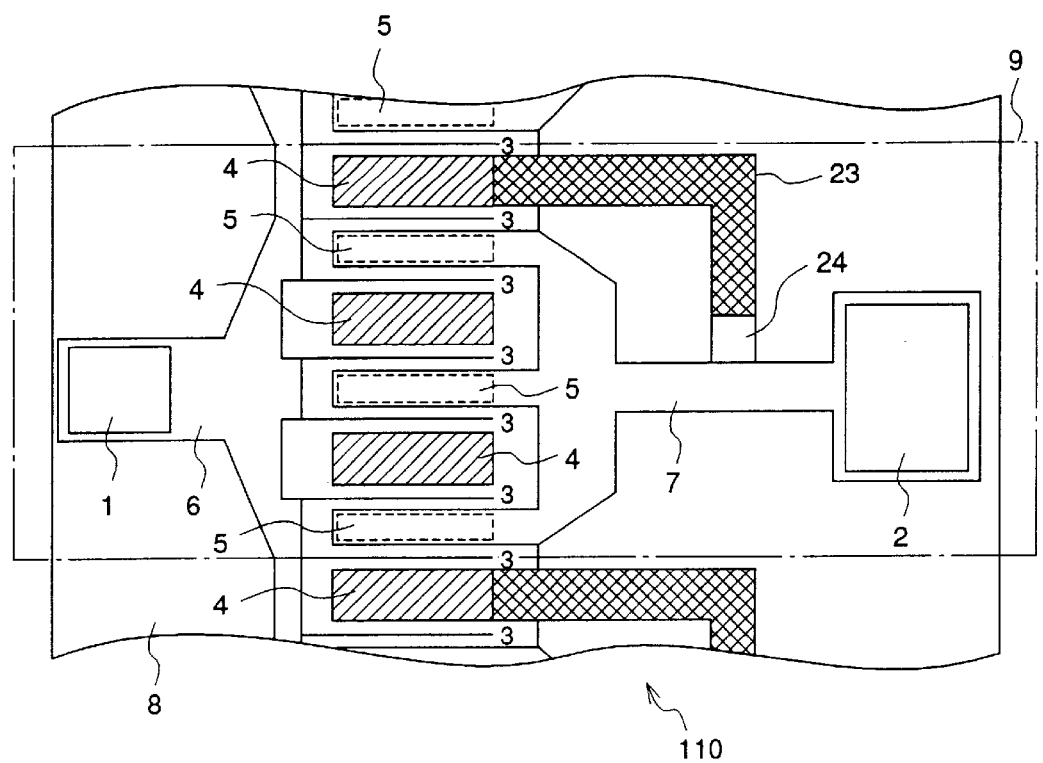
FIG. 1 is a top view partially illustrating a structure of a semiconductor chip of a semiconductor device according to a first embodiment of the present invention.

FIG. 1 is a top view partially illustrating the structure of a semiconductor chip 110 in a semiconductor device according to a first embodiment of the present invention. In the figure, reference numeral 23 designates a ground wiring, numeral 24 designates an MIM capacitor, and the same reference numerals as in FIG. 9 designate the same or corresponding parts. In this description, the semiconductor chip 110 includes FETs as in the prior art.

The semiconductor device of the first embodiment includes a ground wiring 23 formed on a semiconductor substrate 8 before formation of the semiconductor chip 110 on the substrate 8, with one end of the wiring 23 being connected to a source electrode 4 and the other end connected to a drain wiring 7 through an MIM capacitor 24.

Figure 14:
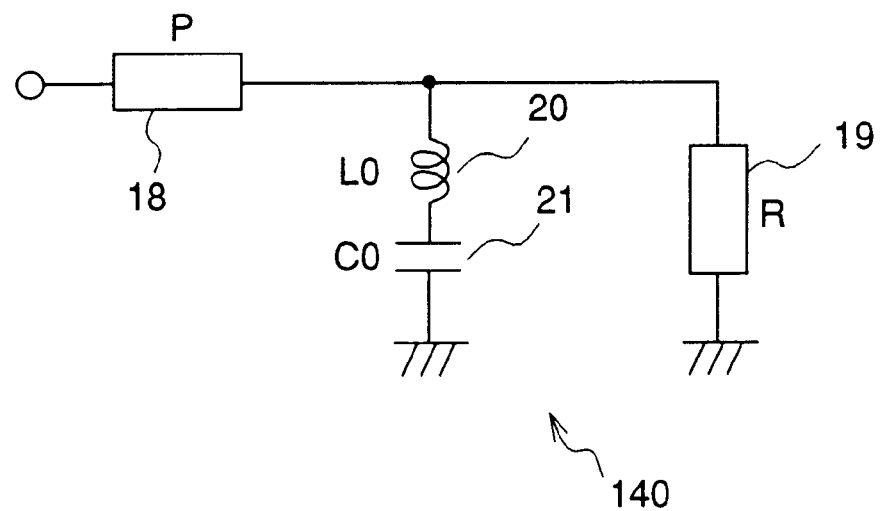
FIG. 14 shows a second example of the output-side external matching circuit 11 of the conventional semiconductor device.

In the above-described structure, the ground wiring 23 and the MIM capacitor 24 correspond to an inductor and a capacitor, respectively, and the combination of the ground wiring 23 and the MIM capacitor 24 forms a harmonic matching circuit 22 equivalent to the output-side external matching circuit 140 shown in FIG. 14.

As described above, according to the first embodiment of the present invention, a semiconductor device having a semiconductor chip comprising plural semiconductor cells, includes harmonic matching circuits, each integrated into the semiconductor chip 110 by means of the ground wiring 23 and the MIM capacitor 24. This structure realizes both a reduction in the loss caused by the characteristics of harmonic signals and a reduction in the phase difference due to the variations in the path lengths between the harmonic matching circuits and the semiconductor chip, whereby an optimal harmonic load impedance is obtained. Therefore, the efficiency of the semiconductor device can be improved as a whole.

Embodiment 2.

Figure 4:
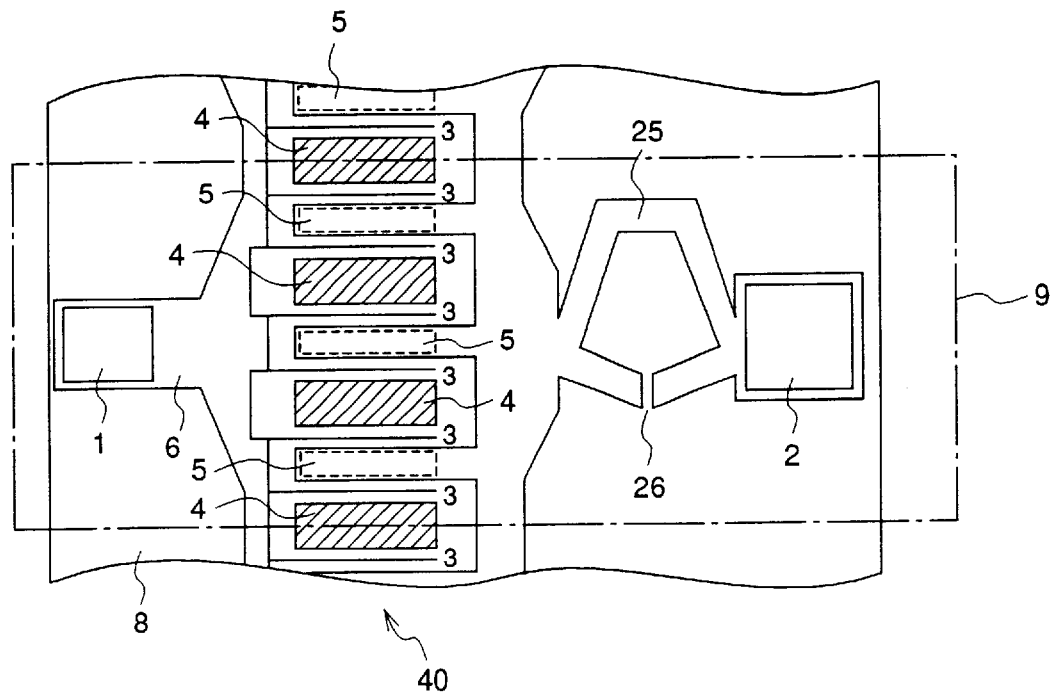
FIG. 4 is a top view partially illustrating a structure of a semiconductor chip of a semiconductor device according to a second embodiment of the present invention.

FIG. 4 is a top view partially illustrating a structure of a semiconductor chip 40 of a semiconductor device according to a second embodiment of the present invention. In the figure, reference numeral 25 designates an inductor wiring, numeral 26 designates a gap capacitor wiring, and the same reference numerals as in FIG. 9 designate the same or corresponding parts.

In the semiconductor device of the second embodiment, each semiconductor cell 9, which is a constituent of the semiconductor chip 40, includes a bifurcated drain wiring that is formed when forming the semiconductor chip 40 on the semiconductor substrate 8. One branch of the bifurcated wiring is a gap capacitor wiring 26 having a gap at some midpoint, and it extends from the drain pad 2 and is connected to the drain electrodes 5. The other branch of the wiring is an inductor wiring 25, which extends arcuately from the drain pad 2 and is connected to the drain electrodes 5.

Figure 13:
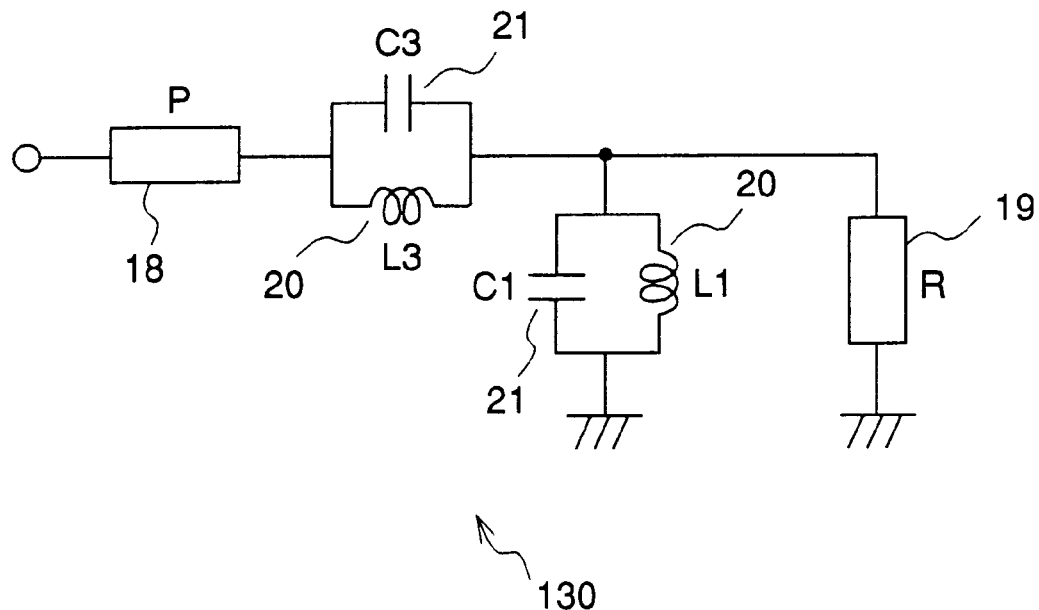
FIG. 13 shows a first example of an output-side external matching circuit 11 of the conventional semiconductor device.

In the above-described structure, the gap capacitor wiring 26 corresponds to the capacitor 21 (capacitance $C_3$) of the output-side external matching circuit 130 shown in FIG. 13 because the wiring 26 has a gap at some midpoint. The inductor wiring 25 also corresponds to the inductor 20 (inductance $L_3$) in the same figure. The combination of the gap capacitor wiring 26 and the inductor wiring 25 forms a harmonic matching circuit 22 equivalent to a resonant circuit comprising the inductor 20 and the capacitor 21, and thus the semiconductor device of this embodiment can be used as an equivalent of the semiconductor device of the first embodiment.

As described above, according to the second embodiment of the present invention, the semiconductor device having a semiconductor chip comprising plural semiconductor cells, includes harmonic matching circuits 22, each integrated into the semiconductor chip 40 by means of the gap capacitor wiring 26 and the inductor wiring 25. Therefore, a high efficiency semiconductor device capable of providing the same effects as the semiconductor device of the first embodiment is available.

Further, in the semiconductor device of the second embodiment, since the gap capacitor wiring 26 and the inductor wiring 25 are formed by forming a pattern on the semiconductor substrate 8, parts such as MIM capacitors are not required. Therefore, the package can be further miniaturized and semiconductor devices can be fabricated easily and inexpensively.

Embodiment 3.

Figure 5:
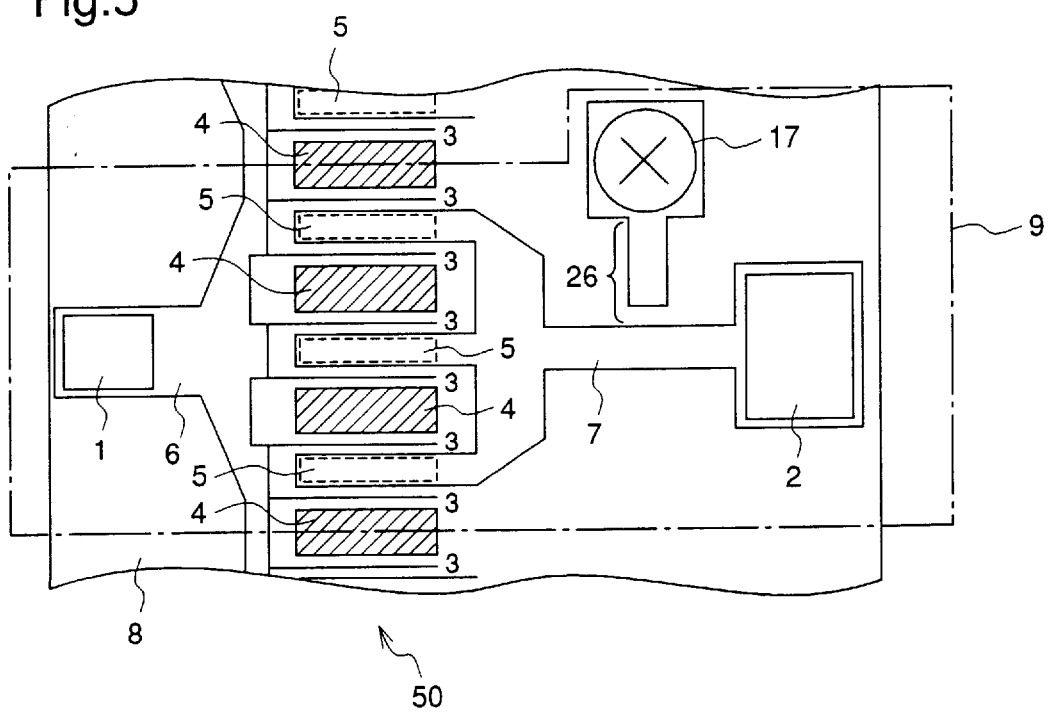
FIG. 5 is a top view partially illustrating a structure of a semiconductor chip of a semiconductor device according to a third embodiment of the present invention.

FIG. 5 is a top view partially illustrating the structure of a semiconductor chip 50 used in a semiconductor device according to a third embodiment of the present invention. In the figure, the same reference numerals as in FIG. 9 designate the same or corresponding parts.

In a semiconductor device 500 according to the third embodiment, each semiconductor cell 9, which is a constituent of the semiconductor chip 50, includes a via hole 17 in the vicinity of a drain wiring 7, and a gap capacitor wiring 26 extending through the via hole 17 to the drain wiring 7. The via hole 17 and the gap capacitor wiring 26 are formed when the semiconductor chip 50 is formed on the semiconductor substrate 8.

In the above-described structure, the via hole 17 corresponds to an inductor, and the gap capacitor wiring 26 corresponds to a capacitor. The combination of the via hole 17 and the gap capacitor wiring 26 forms a harmonic matching circuit 22 which is an equivalent of the output-side external matching circuit 130 shown in FIG. 13, and thus the semiconductor device of this embodiment can be used as an equivalent of the semiconductor device according to the first embodiment.

As described above, according to the third embodiment of the present invention, a semiconductor device having a semiconductor chip comprising plural semiconductor cells, includes harmonic matching circuits, each integrated into the semiconductor chip 50 by means of the via hole 17 and the gap capacitor wiring 26. Therefore, it is possible to realize a high efficiency semiconductor device capable of providing the same effects as the semiconductor device of the first embodiment.

Further, in the semiconductor device of the third embodiment, since the inductance (0.02 nH~several nH) of the via hole 17 is used as an inductor, the combination of the via hole 17 and the gap capacitor wiring 26 can be located at any arbitrary position on the semiconductor substrate 8 in each semiconductor cell, thereby increasing the design flexibility of the semiconductor chip 50.

Embodiment 4.

Figure 6:
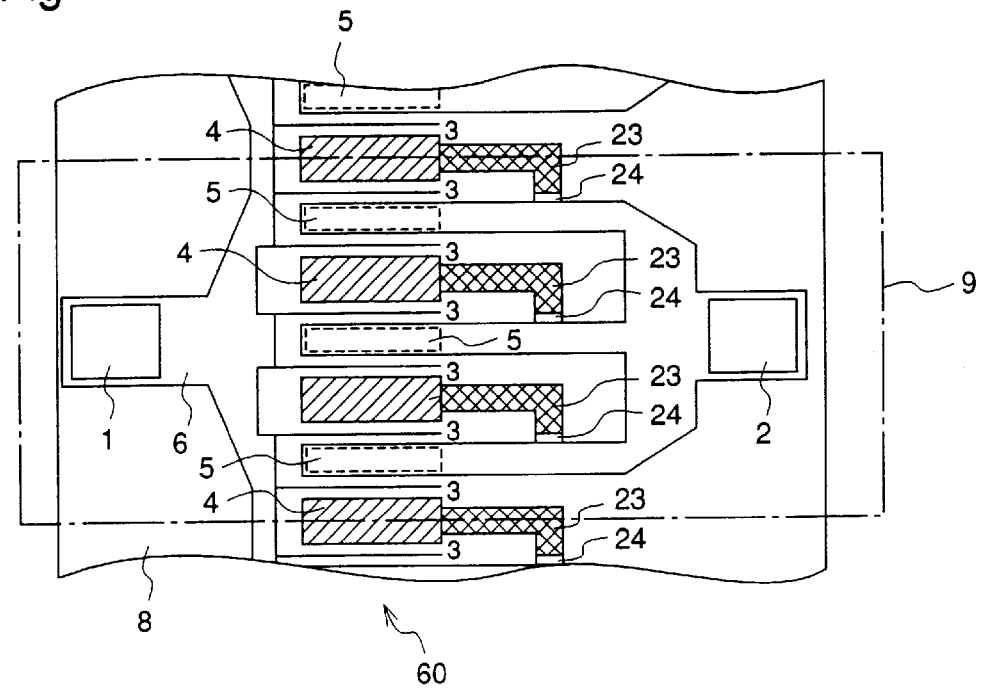
FIG. 6 is a top view partially illustrating a structure of a semiconductor chip of a semiconductor device according to a fourth embodiment of the present invention.

FIG. 6 is a top view partially illustrating the structure of a semiconductor chip 60 used in a semiconductor device according to a fourth embodiment of the present invention. In the figure, the same reference numerals as in FIG. 1 designate the same or corresponding parts.

According to the fourth embodiment of the present invention, in the semiconductor device of the first embodiment, a plurality of harmonic matching circuits, each comprising a ground wiring 23 and an MIM capacitor 24, are provided for each semiconductor cell 9.

In the above-described structure, since a plurality of harmonic matching circuits integrated into a semiconductor chip 60 are provided in each semiconductor cell, the lengths of the respective paths between the semiconductor components and the harmonic matching circuit within the semiconductor cell can be made more uniform.

The structure of the semiconductor device according to the fourth embodiment is applicable to the semiconductor devices of the second and third embodiments which have been previously described.

Embodiment 5.

According to a fifth embodiment of the present invention, in a semiconductor device including harmonic matching circuits integrated into a semiconductor chip, a low-pass filter circuit is used as the harmonic matching circuit.

Figure 7:
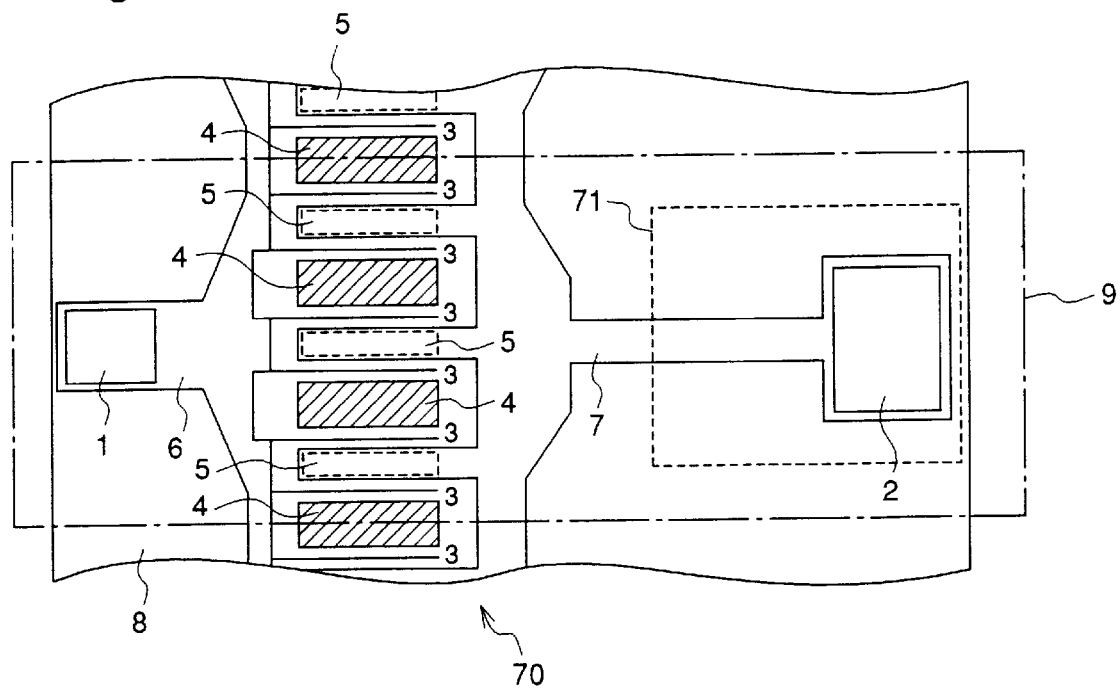
FIG. 7 is a top view partially illustrating a structure of a semiconductor chip of a semiconductor device according to a fifth embodiment of the present invention.

FIG. 7 is a partial top view of a semiconductor chip 70 used in a semiconductor device according to the fifth embodiment. In the figure, reference numeral 71 designates a low-pass filter circuit, and the same reference numerals as in FIG. 9 designate the same or corresponding parts.

Figure 12:
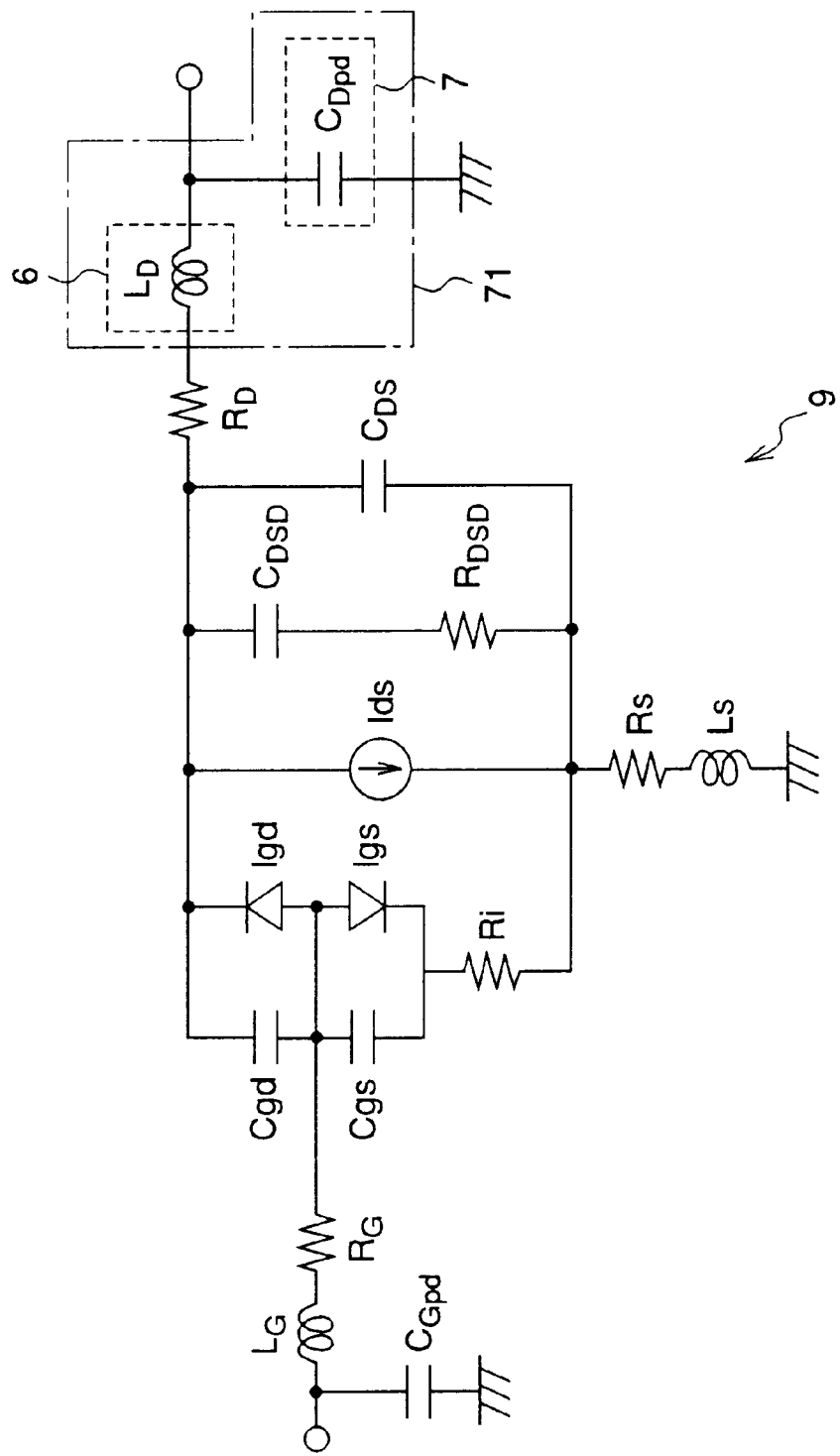
FIG. 12 is an equivalent circuit diagram of the semiconductor cell of the conventional semiconductor device.

A semiconductor device 70 according to the fifth embodiment is structured such that each semiconductor cell has the same structure as the equivalent circuit of the semiconductor cell 9 shown in FIG. 12. In this device 70, however, a low-pass filter circuit 71 is formed by using the inductance $L_D$ of the drain wiring 7 as the inductor 20 and the pad parasitic capacitance $C_{Dpd}$ between the drain pad 2 and the semiconductor substrate 8a as the capacitor 21.

The low-pass filter circuit 71 short-circuits harmonics higher than a cut-off frequency $f_c$:

$$f_c = \frac{1}{2\sqrt{L_D C_{Dpd}}} \quad (4)$$

As is apparent from the partial top view of FIG. 7, an arbitrary value of inductance can be obtained by changing the length or width of the drain wiring 7, and an arbitrary value of capacitance can be obtained by changing the area of the drain pad 2 or the gap between the drain pad 2 and the semiconductor substrate 8. Thus, a desired cut-off frequency can be obtained based on these values. In other words, changing the specifications of the parts on the semiconductor chip 70 is equal to changing the values of the inductance $L_D$ and the capacitance $C_{Dpd}$ in the equivalent circuit of the semiconductor cell 9 shown in FIG. 12.

For example, when $L_D=0.06$ nH and $C_{Dpd}=0.25$ pF in the cell shown in FIG. 12, a cut-off frequency $f_C=41$ GHz is obtained from formula (4). In this case, if the fundamental wave f is 25 GHz, the harmonics equal to or higher than the second harmonic all are short-circuited.

As described above, in the semiconductor device according to the fifth embodiment of the present invention, since the drain wiring 7, the drain pad 2, and the semiconductor substrate 8 work as a low-pass filter circuit 71 in each semiconductor cell 9, each semiconductor cell can have a harmonic matching circuit integrated into the semiconductor chip for harmonic matching, thereby increasing the efficiency of the semiconductor device as a whole.

Further, in the semiconductor device of the fifth embodiment, since harmonic matching is performed in each semiconductor cell without using a MIM capacitor or a gap capacitor to form a harmonic matching circuit, a semiconductor device capable of harmonic matching can be obtained easily and inexpensively.

Further, in the semiconductor device of the fifth embodiment, a low-pass filter matching circuit is used as a harmonic matching circuit. Therefore, if the fabrication accuracy of the semiconductor cells 9 is not uniform, all the harmonics higher than the cut-off frequency $f_C$ can be short-circuited. Accordingly, the semiconductor device is less affected by variations in harmonics from semiconductor cell to semiconductor cell as compared to the case using the conventional harmonic matching circuits shown in FIGS. 13 and 14.

In addition, in the semiconductor device of the fifth embodiment, since the capacitance between the drain pad 2 and the semiconductor substrate 8 is used as a capacitor, a high precision harmonic matching circuit having a smaller capacitance error than a harmonic matching circuit using a MIM capacitor or a gap capacitor can be obtained.
Embodiment 6.

A semiconductor device according to a sixth embodiment of the present invention is a modification of the semiconductor device of the fifth embodiment including low-pass filter circuits.

Figure 8:
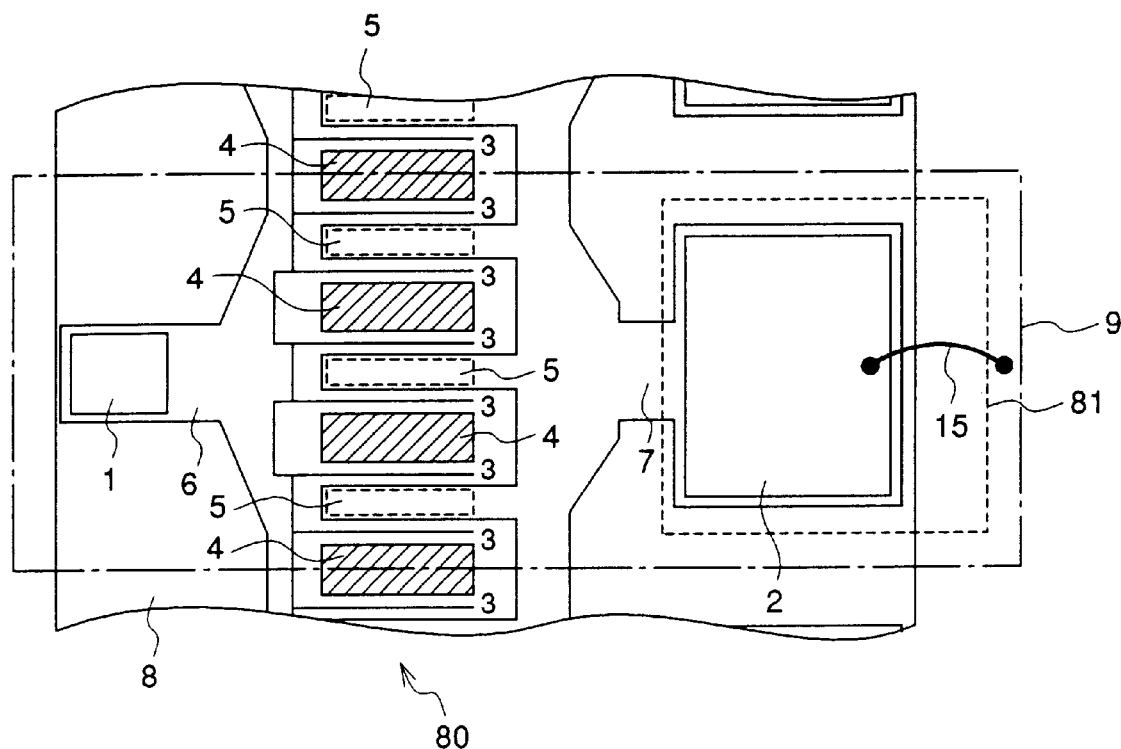
FIG. 8(a) is a top view partially illustrating a structure of a semiconductor chip of a semiconductor device according to a sixth embodiment of the present invention.
FIG. 8(b) is an equivalent circuit diagram of a low-pass filter circuit included in the semiconductor device according to the sixth embodiment of the present invention.
Figure 8:
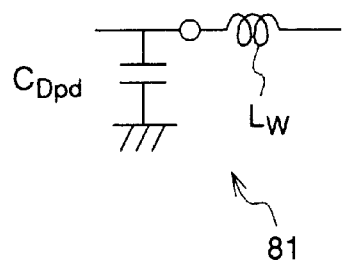

FIG. 8(a) is a partial top view of a semiconductor chip 80 of a semiconductor device according to the sixth embodiment of the present invention, and FIG. 8(b) is an equivalent circuit diagram of a low-pass filter circuit included in the semiconductor chip 80. In the figures, the same reference numerals as in FIG. 9 designate the same or corresponding parts.

Figure 9:
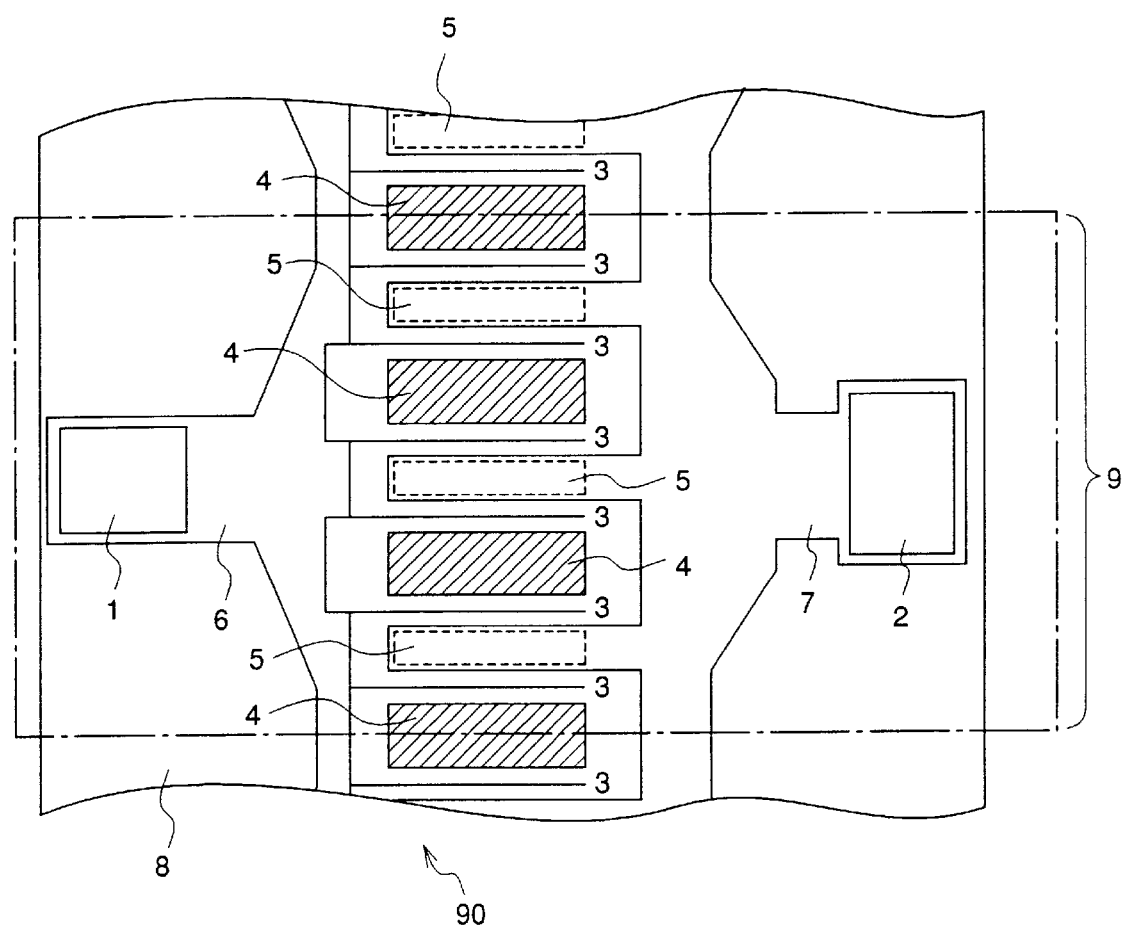
FIG. 9 is a top view partially illustrating a structure of a semiconductor chip of a conventional semiconductor device.
Figure 10:
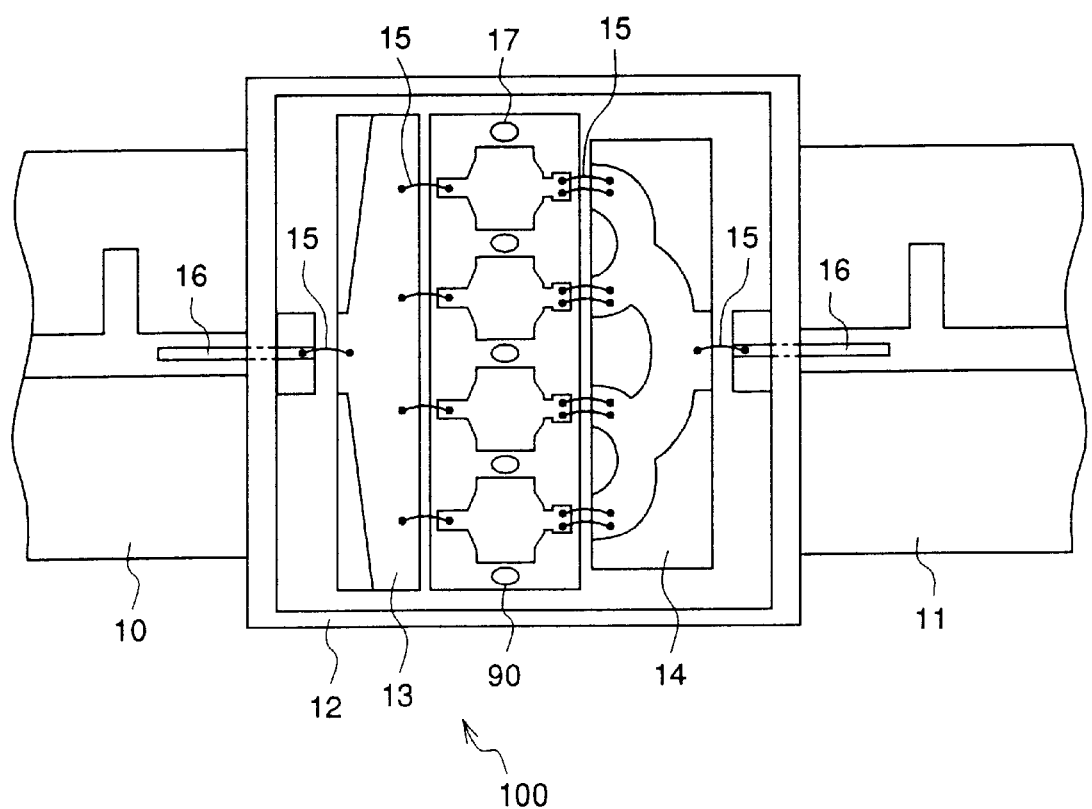
FIG. 10 is a top view illustrating a structure of the conventional semiconductor device.

The semiconductor chip 80 of the sixth embodiment is identical to the conventional semiconductor chip 90 shown in FIG. 9 except that the output-side internal matching circuit 14 and the drain pad 2 are connected by a wire 15.

In the semiconductor device of the sixth embodiment having the above structure, a low-pass filter circuit 81 is formed by using the inductance $L_W$ of the wire 15 of as the inductor 20, in place of that of the drain wiring 7, and using the capacitance $C_{Dpd}$ between the drain pad 2 and the semiconductor substrate 8 as the capacitor 21.

In the equivalent circuit shown in FIG. 8(b), the capacitance $C_{Dpd}$ and the inductance $L_W$ are set so that they have the following relation with respect to inputs having frequencies higher than the cut-off frequency $f_C$:

$$f_c = \frac{1}{2\pi\sqrt{L_W C_{Dpd}}} \quad (5)$$

So, the low-pass filter circuit 81 operates as a harmonic matching circuit integrated into the semiconductor chip 80, as in the fifth embodiment.

As described above, in the semiconductor device according to the sixth embodiment of the present invention, since each semiconductor cell includes such a low-pass filter circuit for harmonic matching, the efficiency of the semiconductor device is increased as a whole.

Further, since a low-pass filter matching circuit is used as the harmonic matching circuit 22, it is possible to obtain a semiconductor device which is hardly affected by the variations in harmonics from cell to cell and can short-circuit all the harmonics equal to or higher than a frequency used, even when the fabrication accuracy of semiconductor chips is not uniform.

Furthermore, in the semiconductor device of the sixth embodiment, since the inductance of the wire 15 is used as the inductor 20 and no inductor is needed in the semiconductor chip 80, the size of the semiconductor chip can be reduced and, therefore, semiconductor devices can be fabricated easily and inexpensively.

In any of the above-described embodiments, it is possible to eliminate external matching circuits and realize a semiconductor device comprising a semiconductor chip integrated into harmonic matching circuits and internal matching circuits within a package.

In this case, the components of the package can be used as a semiconductor device. Therefore, the parts count and the number of wires can be further reduced, whereby the semiconductor devices can be fabricated more easily and inexpensively.

Although in any of the above-described embodiments a semiconductor chip comprises FETs, other types of transistors, such as bipolar transistors, may be applied.

Further, in the above-described embodiments, harmonic matching circuits 22 are arranged at the drain side, but they may be arranged at the gate side.

What is claimed is:

1. A semiconductor device comprising:
    a semiconductor substrate having a first main surface and a second main surface opposite the first main surface;

a semiconductor chip performing amplification in a high frequency band and including a plurality of semiconductor cells on the first main surface of said semiconductor substrate, each semiconductor cell comprising a plurality of semiconductor components connected to a gate pad and a drain pad, each semiconductor component having an electrode;

internal matching circuits;

a harmonic matching circuit provided for each semiconductor cell, integrated into said semiconductor chip on the first main surface of said semiconductor substrate, and located between said semiconductor chip and one of said internal matching circuits, said harmonic matching circuit comprising a capacitor having a capacitance and an inductor having an inductance; and a package enclosing said semiconductor chip, said internal matching circuits, said harmonic matching circuit, and said semiconductor substrate.

2. The semiconductor device of claim 1 further including external matching circuits outside said package.

3. The semiconductor device of claim 1 wherein said capacitor comprises a MIM capacitor located between the electrode of said semiconductor component and said drain pad.

4. The semiconductor device of claim 2 wherein said capacitor comprises an MIM capacitor located between the electrode of said semiconductor component and said drain pad.

5. The semiconductor device of claim 1 wherein said capacitor of said harmonic matching circuit is located between the electrode of said semiconductor component and said drain pad.

6. The semiconductor device of claim 2 wherein said capacitor of said harmonic matching circuit is located between the electrode of said semiconductor component and said drain pad.

7. The semiconductor device of claim 1 wherein said inductor of said harmonic matching circuit is located between a wiring of said drain pad and the second main surface of said semiconductor substrate.

8. The semiconductor device of claim 2 wherein said inductor of said harmonic matching circuit is located between a wiring of said drain pad and the second main surface of said semiconductor substrate.

9. The semiconductor device of claim 1 wherein said inductor of said harmonic matching circuit is an inductance of a wiring interconnecting said drain pad and the electrode of said semiconductor component.

10. The semiconductor device of claim 2 wherein said inductor of said harmonic matching circuit is an inductance of a wiring interconnecting said drain pad and the electrode of said semiconductor component.

11. A semiconductor device comprising:

a semiconductor substrate having a first main surface and a second main surface opposite the first main surface;

a semiconductor chip performing amplification in a high frequency band and including a plurality of semiconductor cells on the first main surface of said semiconductor substrate, each semiconductor cell comprising a plurality of semiconductor components connected to a gate pad and a drain pad, each semiconductor component having an electrode;

internal matching circuits;

a harmonic matching circuit provided for each semiconductor cell and located between said semiconductor chip and one of said internal matching circuits, said harmonic matching circuit comprising a low-pass filter using a capacitance of said drain pad as a capacitor and an inductance of a wiring interconnecting the electrode of said semiconductor component and said drain pad as an inductor; and a package enclosing said semiconductor chip, said internal matching circuits, said harmonic matching circuit, and said semiconductor substrate.

12. The semiconductor device of claim 2 wherein said harmonic matching circuit is a low-pass filter circuit using a capacitance of said drain pad as a capacitor and an inductance of a wiring interconnecting the electrode of said semiconductor component and said drain pad as an inductor.

13. The semiconductor device of claim 1 wherein said harmonic matching circuit is a low-pass filter circuit using a capacitance of said drain pad as a capacitor and an inductance of a wiring interconnecting the electrode of said semiconductor component and said drain pad as an inductor.

14. The semiconductor device of claim 11 wherein the inductor of said low-pass filter circuit is an inductance of a wire disposed on said drain pad.

15. The semiconductor device of claim 12 wherein the inductor of said low-pass filter circuit is an inductance of a wire disposed on said drain pad.

16. The semiconductor device of claim 13 wherein the inductor of said low-pass filter circuit is an inductance of a wire disposed on said drain pad.

17. The semiconductor device of claim 11 including external matching circuits outside said package.

18. The semiconductor device of claim 17 wherein the inductor of said low-pass filter is an inductance of a wire disposed on said drain pad.

* * * * *